(12) United States Patent
Zhang (10) Patent No.: US 11,903,293 B2
(45) Date of Patent: Feb. 13, 2024

(54) DISPLAY PANEL AND MANUFACTURING METHOD FOR DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Yang Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 222 days.

(21) Appl. No.: 17/593,894

(22) PCT Filed: Jun. 24, 2021

(86) PCT No.: PCT/CN2021/101991
§ 371 (c)(1),
(2) Date: Sep. 27, 2021

(87) PCT Pub. No.: WO2022/236931
PCT Pub. Date: Nov. 17, 2022

(65) Prior Publication Data
US 2023/0240114 A1    Jul. 27, 2023

(30) Foreign Application Priority Data
May 8, 2021   (CN) .......................... 202110498144.4

(51) Int. Cl.
*G06F 3/041*   (2006.01)
*H10K 59/40*   (2023.01)
*H10K 71/00*   (2023.01)

(52) U.S. Cl.
CPC ........... *H10K 59/40* (2023.02); *G06F 3/0412* (2013.01); *H10K 71/00* (2023.02); *G06F 2203/04103* (2013.01)

(58) Field of Classification Search
CPC ........ H10K 59/40; H10K 59/00; H10K 59/50; H10K 71/00; G06F 3/0412; G06F 3/045;
(Continued)

(56) References Cited

U.S. PATENT DOCUMENTS 9,818,973 B2    11/2017   Lee et al.
2013/0002133 A1*   1/2013   Jin ..................... H10K 77/111
                                                         313/511
(Continued)

FOREIGN PATENT DOCUMENTS

CN          103558954 A        2/2014
CN          106453714 A   *    2/2017   ............. G06F 3/041
(Continued)

OTHER PUBLICATIONS

International Search Report in International application No. PCT/CN2021/101991, dated Jan. 26, 2022.
(Continued)

*Primary Examiner* — Pegeman Karimi (57) ABSTRACT

A display panel and a manufacturing method for a display panel are provided. The display panel includes a base layer, a touch layer, and a filling layer. In the present application, the touch layer only disposed in the flat display areas, so that the first curved display areas only have display functions without touch functions. Therefore, when a user touches the first curved display panel areas, no touch signal is generated, and other operations of the user are not affected, thereby improving the user.

10 Claims, 5 Drawing Sheets

(58) Field of Classification Search
CPC ........... G06F 2203/04103; G06F 3/041; G06F 2203/041
See application file for complete search history.

(56) References Cited

U.S. PATENT DOCUMENTS

| | | | | |
|---|---|---|---|---|
| 2013/0002583 A1* | 1/2013 | Jin | ................... | G06F 3/041 |
| | | | | 313/511 |
| 2013/0194220 A1* | 8/2013 | Lee | ................... | G06F 3/041 |
| | | | | 345/173 |
| 2013/0287272 A1* | 10/2013 | Lu | ................... | G06V 40/13 |
| | | | | 345/173 |
| 2015/0153881 A1* | 6/2015 | Misaki | ................... | G06F 3/0412 |
| | | | | 345/174 |
| 2016/0104752 A1* | 4/2016 | Oh | ................... | H10K 59/121 |
| | | | | 257/40 |
| 2017/0353181 A1* | 12/2017 | Kim | ................... | G06F 3/0416 |
| 2019/0302939 A1 | 10/2019 | Hong et al. | | |
| 2019/0305050 A1* | 10/2019 | Ishizuya | ................... | H10K 59/38 |
| 2021/0089165 A1* | 3/2021 | Ren | ................... | G06F 3/0412 |

FOREIGN PATENT DOCUMENTS

| | | |
|---|---|---|
| CN | 106453714 A | 2/2017 |
| CN | 109671745 A | 4/2019 |
| CN | 110165085 A | 8/2019 |
| CN | 110286797 A | 9/2019 |
| CN | 110429088 A | 11/2019 |
| CN | 111613628 A | 9/2020 |
| CN | 111754870 A | 10/2020 |
| CN | 112017546 A | 12/2020 |

OTHER PUBLICATIONS

Written Opinion of the International Search Authority in International application No. PCT/CN2021/101991, dated Jan. 26, 2022.
Chinese Office Action issued in corresponding Chinese Patent Application No. 202110498144.4 dated Jan. 28, 2022, pp. 1-10.
Chinese Office Action issued in corresponding Chinese Patent Application No. 202110498144.4 dated Jul. 26, 2022, pp. 1-9.
Chinese Office Action issued in corresponding Chinese Patent Application No. 202110498144.4 dated Mar. 27, 2023, pp. 1-9.

* cited by examiner

DISPLAY PANEL AND MANUFACTURING METHOD FOR DISPLAY PANEL

FIELD OF INVENTION

The present disclosure relates to the field of display technologies, and more particularly, to a display panel and a manufacturing method for a display panel.

BACKGROUND OF INVENTION

Organic light-emitting diodes (OLED) are also called organic electro-laser display devices or organic light-emitting semiconductors. OLED has the advantages of low voltage demand, high power saving efficiency, fast response times, light weight, thin thickness, simple structures, low costs, wide viewing angles, almost infinitely high contrast, low power consumption, and extremely high response speed. OLED has become one of the most important display technologies at present.

In the modern communication industry, the market demand for display devices, such as mobile phones, televisions, tablets, notebooks, digital cameras, is increasing. In order to enhance the visual effect and the immersive effect received by users, people are pursuing a higher screen-to-body ratio. The screen-to-body ratio is an important indicator for the screen of a display device. Therefore, the shapes of various display devices are no longer limited to flat surfaces but are designed as curved surfaces.

Technical Problems

Figure 1:
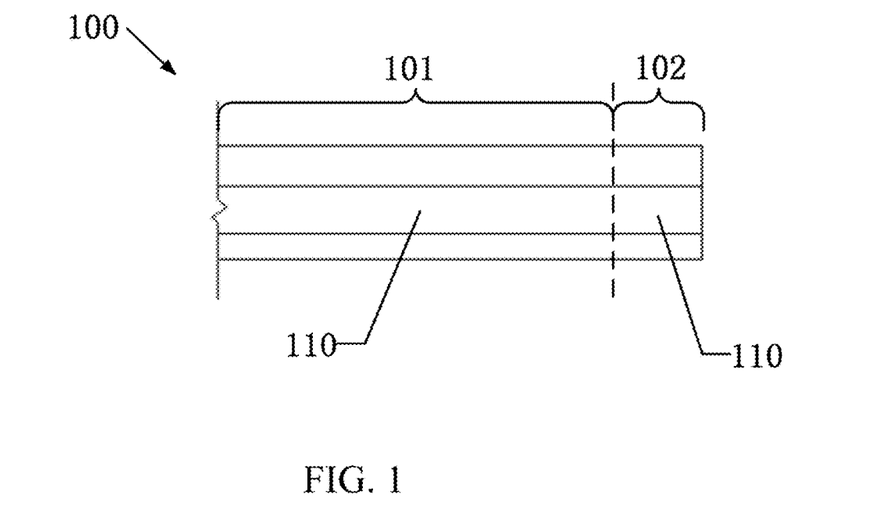
FIG. 1 is a schematic diagram of a layered structure of a display panel in the prior art.

As shown in FIG. 1, a touch layer 110 of an existing display panel is disposed in both a flat display 101 area and a curved display area 102. Therefore, the existing display panel 100 has two problems. First, during the manufacturing process of the display panel 100, the film layers in the curved display area are prone to break. The greater curvature the curved surface has, the easier the curved surface breaks. Second, in actual use, it is easy to touch the curved display area 102 and generate a touch signal, thereby affecting the user experience. Therefore, it is necessary to provide a new type of display panel to solve the problems of the prior art.

SUMMARY OF INVENTION

Technical Solutions

The purpose of the present application is to provide a display panel and a manufacturing method for a display panel, which can solve the problems of the exist display panel in actual use. The problems are that the user easily touches the curved display area to generate a touch signal, thereby affecting the user experience, and the film layers in the curved display area are prone to break.

In order to solve the above problems, the present application provides a display panel having a flat display area and first curved display areas located at a left end and a right end of the flat display area, the display panel including: a base layer located in the flat display area and extending into the first curved display areas; a touch layer disposed on a top surface of the base layer and located in the flat display area, wherein the touch layer does not extend into the first curved display areas; and a filling layer disposed on the top surface of the base layer and located in the first curved display areas, wherein the filling layer is connected to the touch layer; wherein a surface of the filing layer facing the base layer is flush with a surface of the touch layer facing the base layer.

Further, a material of the filling layer is an organic material.

Further, the material of the filling layer is a transparent organic material.

Further, the display panel further includes: a planarization layer disposed on a surface of the touch layer away from the base layer and extending to cover a surface of the filling layer away from the base layer.

Further, a material of the planarization layer is same as a material of the filling layer.

Further, the touch layer includes an add-on touch layer and an in-cell touch layer.

Further, the display panel further includes: second curved display areas located at an upper end and a lower end of the flat display area; wherein the base layer further extends into the second curved display areas; and the touch layer is further located in the second curved display areas.

Further, the touch layer includes: a first inorganic layer disposed on the base layer; a first metal layer disposed on a surface of the first inorganic layer away from the base layer; a second inorganic layer disposed on a surface of the first metal layer away from the base layer; and a plurality of second metal units disposed at intervals on a surface of the second inorganic layer away from the base layer.

In order to solve the above problems, the present application further provides a manufacturing method for a display panel, including following steps of: dividing the display panel into a flat display area and first curved display areas; forming a base layer in the flat display area and the first curved display areas; forming a touch layer on a top surface of the base layer in the flat display area, wherein the touch layer does not extend into the first curved display areas; and forming a filling layer on a top surface the base layer in the first curved display area, wherein the filling layer is connected to the touch layer, and a surface of the filing layer facing the base layer is flush with a surface of the touch layer facing the base layer.

Further, the manufacturing method for a display panel further includes a following step of: forming a planarization layer on a surface of the touch layer away from the base layer and a surface of the filling layer away from the base layer.

Beneficial Effect

The present application relates to a display panel and a manufacturing method for a display panel. In the present application, the touch layer is only disposed in the flat display area, so that the first curved display areas have display functions without touch functions. Therefore, when a user touches the first curved display panel areas, no touch signal is generated, and other operations of the user will not be affected, thereby improving the user experience. In the present application, the organic material is further used to form the filling layer in the first curved display areas, thereby reducing the stress of the display panel in the first curved display areas and preventing the film layers in the first curved display areas from breaking.

DESCRIPTION OF DRAWINGS

In order to more clearly describe the technical solutions in the embodiments of the present application, the following will briefly introduce the drawings needed in the description of the embodiments. Obviously, the drawings in the following description are only some embodiments of the present application. For those skilled in the art, without creative work, other drawings can be obtained based on these drawings.

DETAILED DESCRIPTION OF PREFERRED EMBODIMENTS

The following describes the preferred embodiments of the application in detail with reference to the accompanying drawings in the specification, so as to fully introduce the technical content of the application to those skilled in the art, and to prove that the application can be implemented with examples, so that the technical content disclosed in the application is clearer, and this It is easier for those skilled in the art to understand how to implement this application. However, this application can be embodied by many different forms of embodiments, and the scope of protection of this application is not limited to the embodiments mentioned in the text, and the description of the following embodiments is not intended to limit the scope of this application.

The directional terms mentioned in this application, such as "up", "down", "front", "rear", "left", "right", "inner", "outer", "side", etc. are to the direction in the drawings. The directional terms used herein are used to explain and illustrate the application, not to limit the protection scope of the application.

In the drawings, components with the same structure are denoted by the same numerals, and components with similar structures or functions are denoted by similar numerals. In addition, for ease of understanding and description, the size and thickness of each component shown in the drawings are arbitrarily shown, and the present application does not limit the size and thickness of each component.

Embodiment 1

Figure 2:
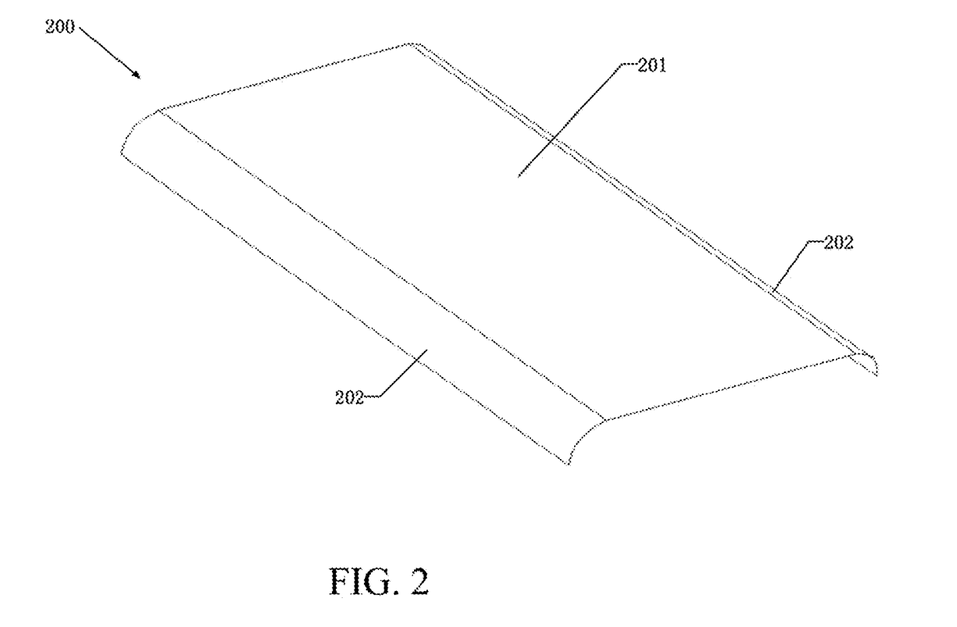
FIG. 2 is a schematic diagram of the structure of a display panel of Embodiment 1 of the present application.

Please refer to FIG. 2. This embodiment provides a display panel 200 having a flat display area 201 and two first curved display areas 202. In this embodiment, the two first curved display panel 202 are relatively connected to a left end and a right end of the flat display area 201.

In this embodiment, a shape of the display panel 200 in the first curved display area 202 is an arc. Therefore, the display surface of the first curved display area 202 in this embodiment is a curved surface.

Figure 3:
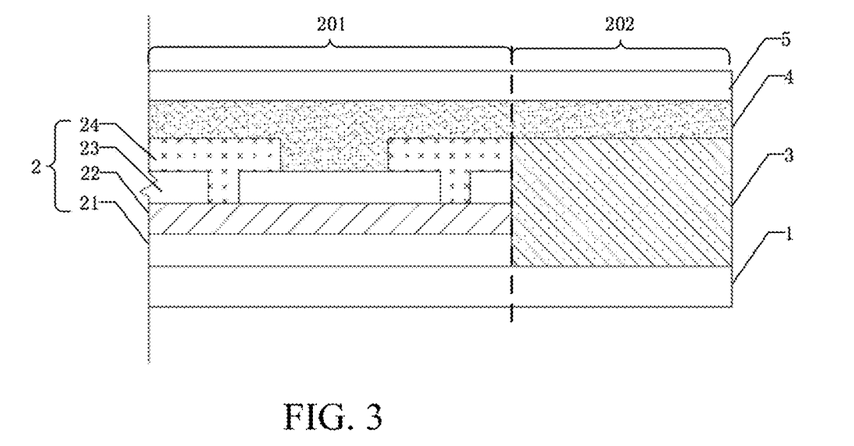
FIG. 3 is a schematic diagram of the layered structure of the display panel of Embodiment 1 of the present application.

Please refer to FIG. 3. The display panel 200 of this embodiment includes: a base layer 1, a touch layer 2, a filling layer 3, a planarization layer 4, and a cover plate 5.

The base layer 1 is located in the flat display area 201 and is extending into the first curved display areas 202. The base layer 1 is a flexible base.

Figure 4:
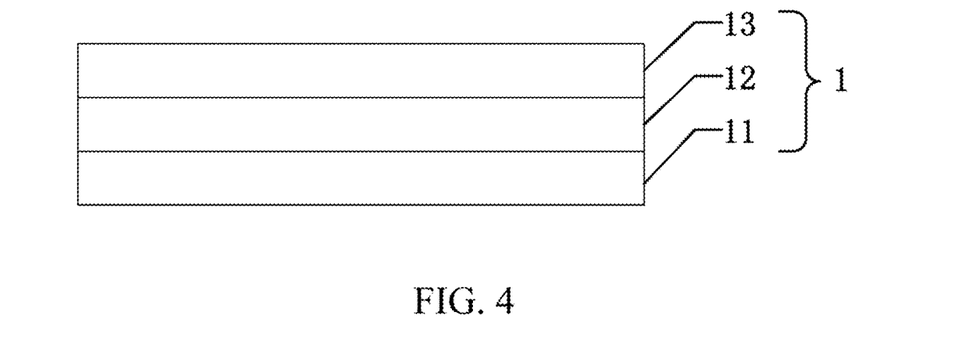
FIG. 4 is a schematic diagram of the layered structure of a base layer of the present application.

Please refer to FIG. 4. The base layer 1 includes: a substrate 11, a thin film transistor layer 12, and a light-emitting layer 13.

The substrate 11 is a flexible substrate, which has a function for blocking water and oxygen. The substrate 11 may have a well impact resistance to protect the display panel 200 efficiently. The material of the substrate 11 includes one or more of polyimide, polycarbonate, polyethylene terephthalate, and polyethylene naphthalate.

The thin film transistor layer 12 is disposed on a surface of the substrate 11 facing the touch layer 2. The thin film transistor layer 12 is used to control the electronic conversion of pixels and to provide circuit support for the display panel 200. Specifically, the thin film transistor layer 12 includes an active layer, a gate insulating layer, a gate layer, an interlayer insulating layer, and a source-drain layer, and the details of the above layers will not be described herein. The thin film transistor layer 12 may have a top gate structure or a bottom gate structure.

The light-emitting layer 13 is disposed on a surface of the thin film transistor layer 12 facing the touch layer 2. The light-emitting layer 13 includes a first electrode layer a light-emitting material layer, a second electrode layer, and the details of the above layers will not be described herein.

As shown in FIG. 3, the touch layer 2 is disposed on a top surface of the base layer 1 and located in the flat display area 201, wherein the touch layer 2 does not extend into the first curved display areas 202. The top surface of the base layer 1 in this embodiment means the surface of the light-emitting layer 13 away from the substrate 11. In this embodiment, the touch layer 2 is only disposed in the flat display area 201, so that the first curved display areas 202 only have display functions without touch functions. Therefore, when a user touches the first curved display panel areas 202, no touch signal is generated, and other operations of the user will not be affected, thereby improving the user experience.

In fact, the display panel 200 further includes an encapsulation layer (not shown). The encapsulation layer is disposed on a surface of the light-emitting layer 13 away from the substrate 11. The encapsulation layer includes a first inorganic layer, an organic layer, and a second inorganic layer, and the details of the above layers will not be described herein.

The touch layer 2 may be an add-on touch layer or an in-cell touch layer. The add-on touch layer includes one of glass-glass (GG), glass-film-film (GFF), glass/film (GF), glass/film sensor/multi ITO (GFM), and one glass solution (OGS). The in-cell touch layer includes an on-cell type in-cell touch layer or an in-cell type in-cell touch layer. When the add-on touch layer or the on-cell type in-cell touch layer is used as the touch layer 2, the touch layer 2 is disposed on a surface of the encapsulation layer away from the substrate 11. When the in-cell type in-cell touch layer is used as the touch layer 2, the touch layer 2 is disposed on a surface of the encapsulation layer facing the substrate 11.

As shown in FIG. 3, the touch layer 2 in this embodiment is the on-cell type in-cell touch layer. The touch layer 2 includes: a first inorganic layer 21, a first metal layer 22, a second inorganic layer 23, and a plurality of second metal units 24. The first inorganic layer 21 is disposed on the top surface of the base layer 1. The first metal layer 22 is disposed on a surface of the first inorganic layer 21 away from the base layer 1. The second inorganic layer 23 is disposed on a surface of the first metal layer 22 away from the base layer 1. The second metal units 24 are disposed at intervals on a surface of the second inorganic layer 23 away from the base layer 1. The second metal units 24 penetrate the second inorganic layer 23, and the second metal units 24 are electrically connected to the first metal layer 22.

As shown in FIG. 3, the filling layer 3 is disposed on the top surface of the base layer 1 and located in the first curved display areas 202, wherein the filling layer 3 is connected to the touch layer 2. A surface of the filing layer 3 facing the base layer 1 is flush with a surface of the touch layer 2 facing the base layer 1. A material of the filling layer 3 is an organic material, preferably a transparent organic material, such as polyimide, polycarbonate, polyethylene terephthalate, and polyethylene naphthalate. In this embodiment, the organic material is used to form the filling layer 3 in the first curved display areas 202, thereby reducing the stress of the display panel 200 in the first curved display areas 202 and preventing the film layers in the first curved display areas 202 from breaking. Furthermore, the use of transparent organic materials can also increase the light transmittance of the display panel 200 in the first curved display areas 202.

Figure 5:
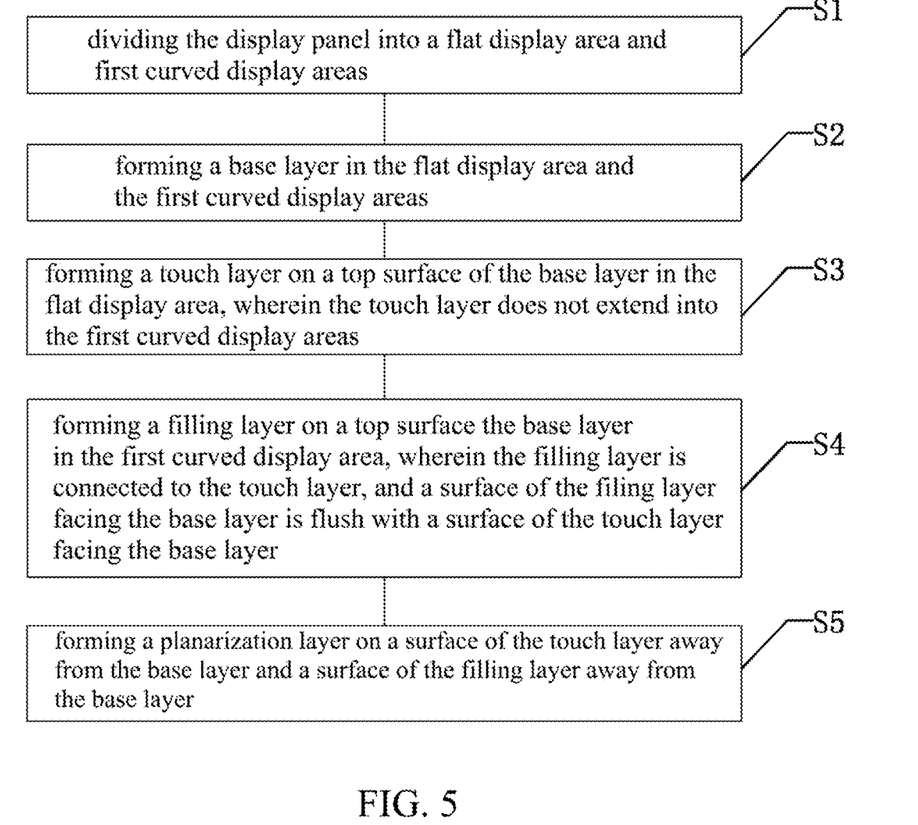
FIG. 5 is a manufacturing flowchart of the display panel of embodiment 1 of the present application.

As shown in FIG. 3, the planarization layer 4 is disposed on a surface of the touch layer 2 away from the base layer 1 and is extending to cover a surface of the filling layer 3 away from the base layer 1. The planarization layer 4 may realize a planarization effect to provide a flat surface for components on the planarization layer 4. The material of the planarization layer 4 is same as or different from the material of the filling layer 3. In this embodiment, the material of the planarization layer 4 is same as the material of the filling layer 3, therefore, the filling layer 3 and planarization layer 4 can be formed in one process step. Using the same material, the filling and planarizing effect can be realized in one process step. Therefore, the production efficiency of the display panel 200 can be increased, and the production cost can be reduced. Please refer to FIG. 5. This embodiment further provides a manufacturing method for the display panel 200, including following steps of: S1, dividing the display panel 200 into a flat display area 201 and first curved display areas 202; S2, forming a base layer 1 in the flat display area 201 and the first curved display areas 202; S3, forming a touch layer 2 on a top surface of the base layer 1 in the flat display area 201, wherein the touch layer 2 does not extend into the first curved display areas 202; and S4, forming a filling layer 3 on a top surface the base layer 1 in the first curved display area 202, wherein the filling layer 3 is connected to the touch layer 2, and a surface of the filing layer 3 facing the base layer 1 is flush with a surface of the touch layer 2 facing the base layer 1. As shown in FIG. 5, the manufacturing method for the display panel 200 further includes: S5, forming a planarization layer 4 on a surface of the touch layer 2 away from the base layer 1 and a surface of the filling layer 3 away from the base layer 1.

The cover plate 5 is used to protect the touch layer 2 and the base layer 1 to prevent the display panel 200 from being damaged by external pressure.

Figure 6:
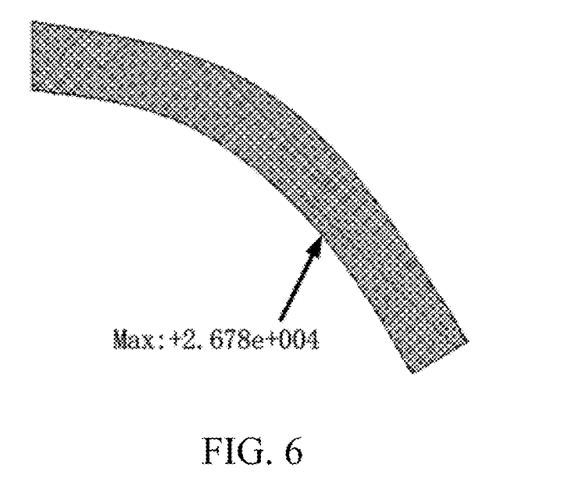
FIG. 6 is a schematic diagram of a simulation of a display panel in the prior art.

Please refer to FIG. 6. The display panel 100 in the prior art is simulated by a simulation software. When an arc angle of the curved display area 102 is 57 degrees, the point with the maximum stress of this display panel 100 in the prior art is on the first inorganic layer of the touch layer. At this time, the stress is 2.678e+004 Kpa, i.e. 26.78 Mpa.

Figure 7:
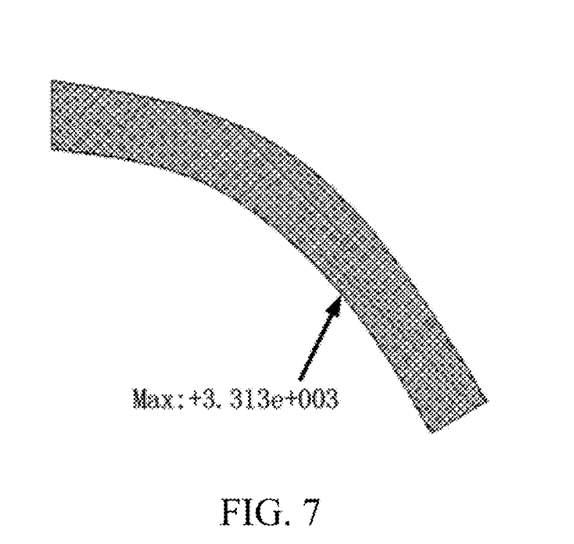
FIG. 7 is a schematic diagram of a simulation of a display panel of Embodiment 1 of the present application.

Please refer to FIG. 7. The display panel 200 of this embodiment is simulated by the simulation software. When the arc angle of the curved display area 202 is 57 degrees, the point with the maximum stress of the display panel 200 of this embodiment is on the filling layer. At this time, the stress is 3.31e+003 Kpa, i.e. 3.31 Mpa. Compared with the display panel 100 in the prior art, the stress of the display panel 200 of this embodiment is reduced by 87%.

Embodiment 2

Figure 8:
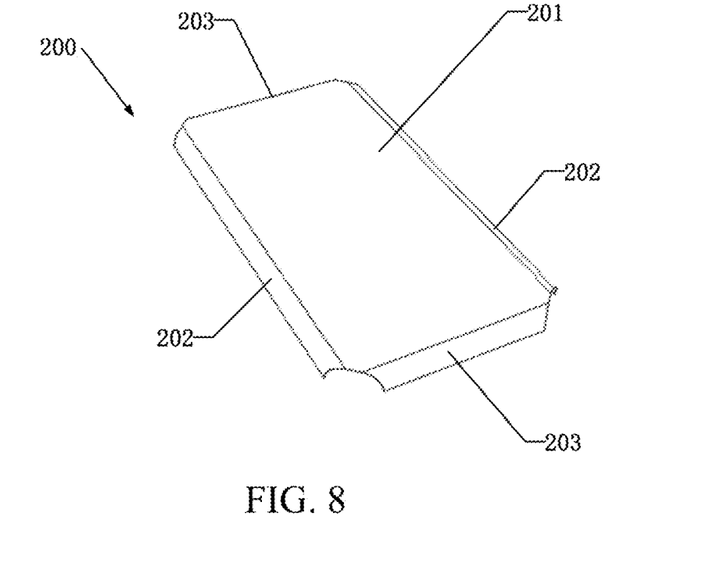
FIG. 8 is a schematic diagram of the structure of a display panel of Embodiment 2 of the present application.

Please refer to FIG. 8, This embodiment provides a display panel 200 having a flat display area 201 and first curved display areas 202 located at a left end and a right end of the flat display area 201, and second curved display areas 203 located at an upper end and a lower end of the flat display area 201. That is, the first curved display areas 202 and the second curved display areas 203 are located around the flat display area 201.

In this embodiment, a shape of the display panel 200 in the first curved display areas 202 and the second curved display areas 203 is arc. Therefore, in this embodiment, the display surface of the first curved display area 202 and the display surface of the second curved display area 203 are curved surfaces.

As shown in FIG. 3, the layered structure diagram of the display panel 200 of this embodiment is the same as the layered structure diagram of the display panel 200 of Embodiment 1. The display panel 200 of this embodiment includes: a base layer 1, a touch layer 2, a filling layer 3, a planarization layer 4, and a cover plate 5.

The base layer 1 is located in the flat display area 101 and is extending into the first curved display areas 202 and the second curved display areas 203. The base layer 1 is a flexible base.

As shown in FIG. 4, the base layer 1 includes: a substrate 11, a thin film transistor layer 12, and a light-emitting layer 13.

The substrate 11 is a flexible substrate, which has a function for blocking water and oxygen. The substrate 11 may have a well impact resistance to protect the display panel 200 efficiently. The material of the substrate 11 includes one or more of polyimide, polycarbonate, polyethylene terephthalate, and polyethylene naphthalate.

The thin film transistor layer 12 is disposed on a surface of the substrate 11 facing the touch layer 2. The thin film transistor layer 12 is used to control the electronic conversion of pixels and to provide circuit support for the display panel 200. Specifically, the thin film transistor layer 12 includes an active layer, a gate insulating layer, a gate layer, an interlayer insulating layer, and a source-drain layer, and the details of the above layers will not be described herein. The thin film transistor layer 12 may have a top gate structure or a bottom gate structure.

The light-emitting layer 13 is disposed on a surface of the thin film transistor layer 12 facing the touch layer 2. The light-emitting layer 13 includes a first electrode layer a light-emitting material layer, a second electrode layer, and the details of the above layers will not be described herein.

As shown in FIG. 3, considering the user's operation, a touch on the first curved display area 202 is often occurred by mistake. In this embodiment, the touch layer 2 is disposed on a top surface of the base layer 1 and located in the flat display area 201 and the second curved display areas 203, wherein the touch layer 2 does not extend into the first curved display areas 202. The top surface of the base layer 1 in this embodiment means the surface of the light-emitting layer 13 away from the substrate 11. In this embodiment, the touch layer 2 is only disposed in the flat display area 201 and the second curved display areas 203, so that the first curved display areas 202 only have display functions without touch functions. Therefore, when a user touches the first curved display panel areas 202, no touch signal is generated, and other operations of the user will not be affected, thereby improving the user experience. In other embodiment, the touch layer 2 in the second curved display areas 203 are further removed, so that the second curved display areas 203 only have display functions without touch functions.

In fact, the display panel 200 further includes an encapsulation layer (not shown). The encapsulation layer is disposed on a surface of the light-emitting layer 13 away from the substrate 11. The encapsulation layer includes a first inorganic layer, an organic layer, and a second inorganic layer, and the details of the above layers will not be described herein.

The touch layer 2 may be an add-on touch layer or an in-cell touch layer. The add-on touch layer includes one of glass-glass (GG), glass-film-film (GFF), glass/film (GF), glass/film sensor/multi ITO (GFM), and one glass solution (OGS). The in-cell touch layer includes an on-cell type in-cell touch layer or an in-cell type in-cell touch layer. When the add-on touch layer or the on-cell type in-cell touch layer is used as the touch layer 2, the touch layer 2 is disposed on a surface of the encapsulation layer away from the substrate 11. When the in-cell type in-cell touch layer is used as the touch layer 2, the touch layer 2 is disposed on a surface of the encapsulation layer facing the substrate 11

As shown in FIG. 7, the touch layer 2 in this embodiment is the on-cell type in-cell touch layer. The touch layer 2 includes: a first inorganic layer 21, a first metal layer 22, a second inorganic layer 23, and a plurality of second metal units 24. The first inorganic layer 21 is disposed on the top surface of the base layer 1. The first metal layer 22 is disposed on a surface of the first inorganic layer 21 away from the base layer 1. The second inorganic layer 23 is disposed on a surface of the first metal layer 22 away from the base layer 1. The second metal units 24 are disposed at intervals on a surface of the second inorganic layer 23 away from the base layer 1. The second metal units 24 penetrate the second inorganic layer 23, and the second metal units 24 are electrically connected to the first metal layer 22.

As shown in FIG. 3, the filling layer 3 is disposed on the top surface of the base layer 1 and located in the first curved display areas 202, wherein the filling layer 3 is connected to the touch layer 2. A surface of the filing layer 3 facing the base layer 1 is flush with a surface of the touch layer 2 facing the base layer 1. A material of the filling layer 3 is an organic material, preferably a transparent organic material, such as polyimide, polycarbonate, polyethylene terephthalate, and polyethylene naphthalate. In this embodiment, the organic material is used to form the filling layer 3 in the first curved display areas 202, thereby reducing the stress of the display panel 200 in the first curved display areas 202 and preventing the film layers in the first curved display areas 202 from breaking. Furthermore, the use of transparent organic materials can also increase the light transmittance of the display panel 200 in the first curved display areas 202.

As shown in FIG. 3, the planarization layer 4 is disposed on a surface of the touch layer 2 away from the base layer 1 and extends to cover a surface of the filling layer 3 away from the base layer 1. The planarization layer 4 may realize a planarization effect to provide a flat surface for components on the planarization layer 4. The material of the planarization layer 4 is same as or different from the material of the filling layer 3. In this embodiment, the material of the planarization layer 4 is same as the material of the filling layer 3, therefore, the filling layer 3 and planarization layer 4 can be formed in one process step. Using the same material, the filling and planarizing effect can be realized in one process step. Therefore, the production efficiency of the display panel 200 can be increased, and the production costs can be reduced.

Figure 9:
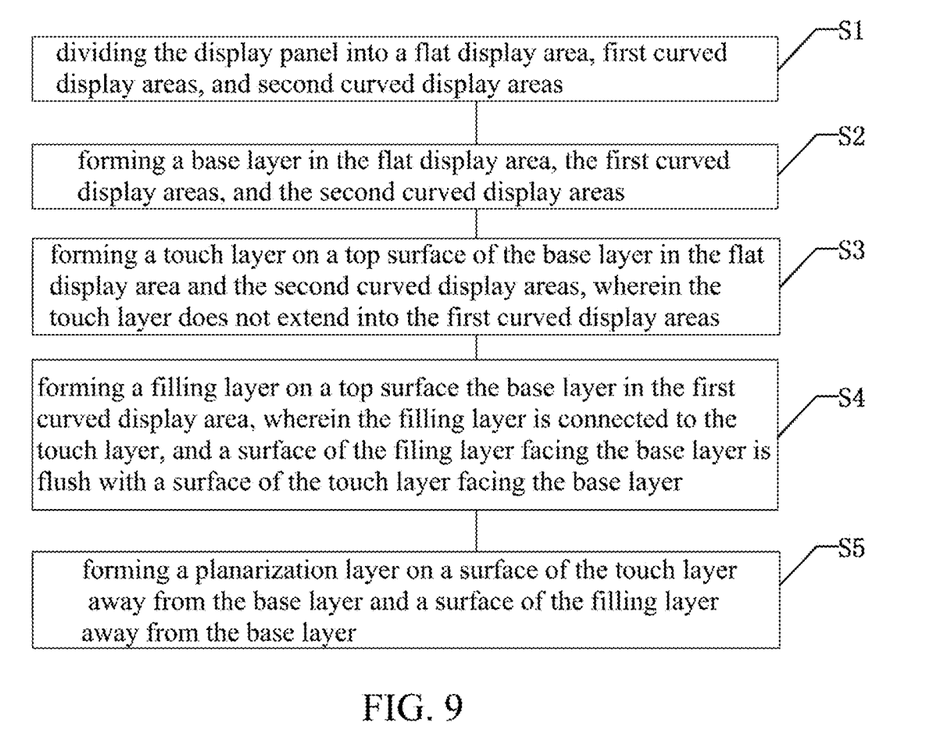
FIG. 9 is a manufacturing flowchart of the display panel of Embodiment 2 of the present application.

Please refer to FIG. 9. This embodiment further provides a manufacturing method for the display panel 200, including following steps of: S1, dividing the display panel 200 into a flat display area 201, first curved display areas 202, and second curved display areas 203; S2, forming a base layer 1 in the flat display area 201, the first curved display areas 202, and the second curved display areas 203; S3, forming a touch layer 2 on a top surface of the base layer 1 in the flat display area 201 and the second curved display areas 203, wherein the touch layer 2 does not extend into the first curved display areas 202; and S4, forming a filling layer 3 on a top surface the base layer 1 in the first curved display area 202, wherein the filling layer 3 is connected to the touch layer 2, and a surface of the filing layer 3 facing the base layer 1 is flush with a surface of the touch layer 2 facing the base layer 1. As shown in FIG. 9, the manufacturing method for the display panel 200 further includes: S5, forming a planarization layer 4 on a surface of the touch layer 2 away from the base layer 1 and a surface of the filling layer 3 away from the base layer 1.

The cover plate 5 is used to protect the touch layer 2 and the base layer 1 to prevent the display panel 200 from being damaged by external pressure.

As shown in FIG. 6, the display panel 100 in the prior art is simulated by a simulation software. When an arc angle of the curved display area 102 is 57 degrees, the point with the maximum stress of this display panel 100 in the prior art is on the first inorganic layer of the touch layer. At this time, the stress is 2.678e+004 Kpa, i.e. 26.78 Mpa.

As shown in FIG. 7, the display panel 200 of this embodiment is simulated by the simulation software. When the arc angle of the curved display area 202 is 57 degrees, the point with the maximum stress of the display panel 200 of this embodiment is on the filling layer. At this time, the stress is 3.31e+003 Kpa, i.e. 3.31 Mpa. Compared with the display panel 100 in the prior art, the stress of the display panel 200 of this embodiment is reduced by 87%.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A display panel having a flat display area and first curved display areas located at a left end and a right end of the flat display area, the display panel comprising:
   a base layer located in the flat display area and extending into the first curved display areas;
   a touch layer disposed on a top surface of the base layer and located in the flat display area, wherein the touch layer does not extend into the first curved display areas; and
   a filling layer disposed on the top surface of the base layer and located in the first curved display areas, wherein the filling layer is connected to the touch layer;
   wherein a surface of the filling layer facing the base layer is flush with a surface of the touch layer facing the base layer, wherein the filling layer reduces stress of the display panel in the first curved display areas.

2. The display panel according to claim 1, wherein a material of the filling layer is an organic material.

3. The display panel according to claim 2, wherein the material of the filling layer is a transparent organic material.

4. The display panel according to claim 1, further comprising:
 a planarization layer disposed on a surface of the touch layer away from the base layer and extending to cover a surface of the filling layer away from the base layer.

5. The display panel according to claim 4, wherein a material of the planarization layer is same as a material of the filling layer.

6. The display panel according to claim 1, wherein the touch layer comprises an add-on touch layer and an in-cell touch layer.

7. The display panel according to claim 1, further comprising second curved display areas located at an upper end and a lower end of the flat display area;
 wherein the base layer further extends into the second curved display areas; and
 the touch layer is further located in the second curved display areas.

8. The display panel according to claim 1, wherein the touch layer comprises:
 a first inorganic layer disposed on the base layer;
 a first metal layer disposed on a surface of the first inorganic layer away from the base layer;
 a second inorganic layer disposed on a surface of the first metal layer away from the base layer; and
 a plurality of second metal units disposed at intervals on a surface of the second inorganic layer away from the base layer.

9. A manufacturing method for a display panel, comprising following steps of:
 dividing the display panel into a flat display area and first curved display areas;
 forming a base layer in the flat display area and the first curved display areas;
 forming a touch layer on a top surface of the base layer in the flat display area, wherein the touch layer does not extend into the first curved display areas; and
 forming a filling layer on a top surface the base layer in the first curved display area, wherein the filling layer is connected to the touch layer, and a surface of the filling layer facing the base layer is flush with a surface of the touch layer facing the base layer,
 wherein the filling layer reduces stress of the display panel in the first curved display areas.

10. The manufacturing method for a display panel according to claim 9, further comprising a following step of:
 forming a planarization layer on a surface of the touch layer away from the base layer and a surface of the filling layer away from the base layer.

\* \* \* \* \*